US009257337B2

(12) United States Patent
Chen et al.

(10) Patent No.: US 9,257,337 B2
(45) Date of Patent: Feb. 9, 2016

(54) SEMICONDUCTOR STRUCTURE AND MANUFACTURING METHOD THEREOF

(71) Applicant: Industrial Technology Research Institute, Hsinchu (TW)

(72) Inventors: Shang-Chun Chen, Hsinchu County (TW); Cha-Hsin Lin, Miaoli County (TW); Yu-Chen Hsin, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/574,348

(22) Filed: Dec. 17, 2014

(65) Prior Publication Data
US 2015/0104927 A1   Apr. 16, 2015

Related U.S. Application Data

(63) Continuation-in-part of application No. 14/033,524, filed on Sep. 23, 2013, now Pat. No. 9,041,163.

(30) Foreign Application Priority Data

Apr. 17, 2013  (TW) ............... 102113615 A

(51) Int. Cl.
H01L 21/768 (2006.01)
H01L 23/48 (2006.01)
(Continued)

(52) U.S. Cl.
CPC ...... *H01L 21/76898* (2013.01); *H01L 21/3065* (2013.01); *H01L 21/30655* (2013.01);
(Continued)

(58) Field of Classification Search
CPC ................ H01L 21/76898; H01L 21/3065; H01L 21/30655; H01L 21/8221; H01L 23/481; H01L 24/80
See application file for complete search history.

(56) References Cited

U.S. PATENT DOCUMENTS 8,049,327 B2   11/2011   Kuo et al.
8,062,975 B2   11/2011   Sanders et al.
(Continued)

FOREIGN PATENT DOCUMENTS

TW   201027703   7/2010
TW   201240040   10/2012

OTHER PUBLICATIONS

Charbonnier, J., et al., "Wafer Level Packaging Technology Development for CMOS Image Sensors Using Through Silicon Vias," 2nd Electronics System-Integration Technology Conference, Sep. 1-4, 2008, pp. 141-148.
(Continued)

*Primary Examiner* — Daniel Shook
(74) *Attorney, Agent, or Firm* — Jianq Chyun IP Office

(57) ABSTRACT

A method for fabricating a semiconductor device is provided. The method includes: providing a first wafer having a first active surface and a first rear surface opposite to the first active surface, the first wafer comprising a first circuit formed therein; providing a second wafer having a second active surface and a second rear surface opposite to the second active surface, the second wafer comprising a second circuit formed therein; bonding the first active surface of the first wafer with the second active surface of the second wafer so as to electrically connecting the first circuit and the second circuit; thinning the second wafer from the second rear surface; and forming at least a conductive through via in the second wafer, wherein the conductive through via is electrically connected to the first circuit through the second circuit.

12 Claims, 22 Drawing Sheets

(51) Int. Cl.
 *H01L 21/3065* (2006.01)
 *H01L 21/822* (2006.01)
 *H01L 23/00* (2006.01)

(52) U.S. Cl.
 CPC .......... *H01L21/8221* (2013.01); *H01L 23/481* (2013.01); *H01L 24/80* (2013.01); *H01L 24/05* (2013.01); *H01L 24/13* (2013.01); *H01L 2224/02372* (2013.01); *H01L 2224/0557* (2013.01); *H01L 2224/05548* (2013.01); *H01L 2224/05568* (2013.01); *H01L 2224/05647* (2013.01); *H01L 2224/05655* (2013.01); *H01L 2224/13023* (2013.01); *H01L 2224/13024* (2013.01); *H01L 2224/13147* (2013.01); *H01L 2224/13155* (2013.01); *H01L 2224/9202* (2013.01); *H01L 2224/94* (2013.01)

(56) References Cited

U.S. PATENT DOCUMENTS

| | | | |
|---|---|---|---|
| 8,202,797 | B2 | 6/2012 | Chi et al. |
| 8,232,626 | B2 | 7/2012 | Tsui et al. |
| 8,278,152 | B2 | 10/2012 | Liu et al. |
| 2005/0282356 | A1* | 12/2005 | Lee ........................... 438/458 |
| 2007/0170574 | A1* | 7/2007 | Lauxtermann et al. ....... 257/686 |
| 2007/0190743 | A1 | 8/2007 | Colombo |
| 2008/0272466 | A1 | 11/2008 | Lake |
| 2008/0290524 | A1* | 11/2008 | Lanzerotti et al. ............ 257/770 |
| 2011/0207323 | A1 | 8/2011 | Ditizio |
| 2012/0023225 | A1 | 1/2012 | Imes et al. |
| 2012/0119374 | A1 | 5/2012 | Rahman et al. |
| 2012/0270404 | A1 | 10/2012 | Bajaj et al. |
| 2014/0210058 | A1* | 7/2014 | Lee et al. ...................... 257/657 |

OTHER PUBLICATIONS

Makoto Motoyoshi, "Through-Silicon Via (TSV)," Proceeding of the IEEE, vol. 97, No. 1, Jan. 2009, pp. 43-48.

Nga P. Pham, et al., "Zero-level Packaging for (RF-)MEMS Implementing TSVs and Metal Bonding," 2011 IEEE 61st Electronic Components and Technology Conference (ECTC), May 31, 2011-Jun. 3, 2011, pp. 1588-1595.

Thorsten Matthias, et al, "CMOS Image Sensor Wafer-level Packaging," 2011 12th International Conference on Electronic Packaging Technology and High Density Packaging (ICEPT-HDP), Aug. 8-11, 2011, pp. 1-6.

Y. Kaiho, et al., "3D Integration Technology for 3D Stacked Retinal Chip," 2009 IEEE International Conference on 3D System Integration, Sep. 28-30, 2009, pp. 1-4.

"Notice of Allowance of Taiwan Counterpart Application," issued on Mar. 16, 2015, p. 1-p. 4, in which the listed references were cited.

* cited by examiner

300a

300b

SEMICONDUCTOR STRUCTURE AND MANUFACTURING METHOD THEREOF

CROSS-REFERENCE TO RELATED APPLICATION

This application is a continuation-in-part application of and claims the priority benefit of a prior application Ser. No. 14/033,524, filed on Sep. 23, 2013, now pending. The prior application Ser. No. 14/033,524 claims the priority benefit of Taiwan application serial no. 102113615, filed on Apr. 17, 2013. The entirety of each of the above-mentioned patent applications is hereby incorporated by reference herein and made a part of this specification.

TECHNICAL FIELD

The technical field relates to a semiconductor structure and a manufacturing method thereof.

BACKGROUND

In the field of semiconductor packaging, a through silicon via (TSV) is mainly used for allowing wires on the top surface and the bottom surface to be electrically connected to each other. Distinguished from the conventional semiconductor packaging, through the disposition of the TSV, a plurality of chips within a semiconductor packaging may provide an enhancement of the packaging density of the semiconductor packaging structure, a reduction of the size of the semiconductor packaging structure, an increment of the speed of the device, a reduction of signal delay and power consumption. Accordingly, the development of the TSV technology is advantageous for electronic product miniaturization due to the semiconductor packaging industrial attention to the TSV.

In present, the manufacturing process of the TSV is normally performed after the manufacture of a semiconductor device layer in the semiconductor manufacturing process. In general, a through hole is required to be formed on a wafer during the manufacture of the TSV. For example, the required through hole for forming the TSV may be achieved by an etching process on the back side of the wafer until the formed through hole exposes a complementary metal-oxide semiconductor. Alternatively, the through hole may be formed by an etching process on the front side of the wafer until the through hole extends to the back side of the wafer. The technique of etching the wafer from the front side may possibly damage a metal-oxide semiconductor while the technique of etching the wafer from the back side may prevent an adverse impact on the complementary metal-oxide semiconductor. Therefore, the technique of etching the wafer from the back side to form the through hole grows and becomes mainstream. Nonetheless, due to a higher aspect ratio of the through hole penetrating the wafer, when to stop the etching procedure is difficult to be determined. Hence, the researchers may encounter difficulties in controlling the etching depth of the through hole so that the wafer may not be completely etched or may be over-etched at which the through hole is located. When the through hole is not etched completely, the wires in the complementary metal-oxide semiconductor layer may not be exposed by the through hole and may not be connected to a conductor in the through hole. Thus, an open circuit occurs between the wires and the conductor in the through hole. When the over-etching occurs, notches may be formed at the interface between the substrate and the complementary metal-oxide semiconductor device layer in the wafer, the notches may lead to difficulties in the deposition of an insulting liner layer. For example, the deposition thickness of the insulting liner layer on the notches may be insufficient or the insulting liner layer may be non-continuous on the notches, and therefore the notches may result in electrical leakages. The reliability and the manufacturing yield of the semiconductor structure may be adversely affected.

In view of the foregoing, to properly control the process recipe of a conductive through via to prevent the aforementioned notches during the manufacturing process becomes an important issue.

SUMMARY

In one of exemplary embodiments, a method for fabricating a semiconductor device is provided. The method includes: providing a first wafer having a first active surface and a first rear surface opposite to the first active surface, the first wafer comprising a first circuit formed therein; providing a second wafer having a second active surface and a second rear surface opposite to the second active surface, the second wafer comprising a second circuit formed therein; bonding the first active surface of the first wafer with the second active surface of the second wafer so as to electrically connecting the first circuit and the second circuit; thinning the second wafer from the second rear surface; and forming at least a conductive through via in the second wafer, wherein the conductive through via is electrically connected to the first circuit through the second circuit.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 1-FIG. 4, FIG. 5A, FIG. 6A, FIG. 7A, and FIG. 8 through FIG. 12A (or FIG. 12B) are schematic flow diagrams of a manufacturing method of a semiconductor according to the first embodiment of the disclosure.

FIG. 5A is a cross-sectional schematic diagram of a first side wall portion according to the first embodiment of the disclosure.

FIG. 6A is a cross-sectional diagram of a through hole according to the first embodiment of the disclosure.

FIG. 7A is a cross-sectional diagram of another through hole according to the first embodiment of the disclosure.

FIG. 12A and FIG. 12B are cross-sectional diagrams of different semiconductor structure according to the first embodiment of the disclosure.

DETAILED DESCRIPTION OF DISCLOSED EMBODIMENTS

[The First Embodiment]

Figure 1:
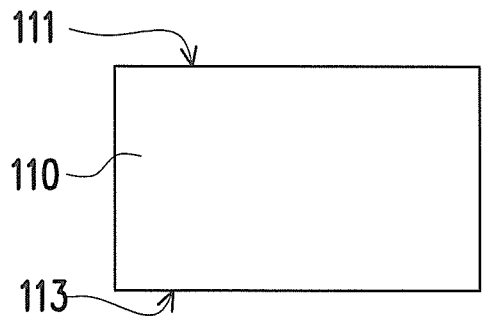

FIG. 1-FIG. 4, FIG. 5A, FIG. 6A, FIG. 7A, and FIG. 8 through FIG. 12A (or FIG. 12B) are schematic flow diagrams of a manufacturing method of a semiconductor according to the first embodiment of the disclosure. Referring to FIG. 1, a substrate 110 is first provided, wherein the substrate 110 includes a first surface 111 and a second surface 113 opposite to each other. In the present embodiment, the substrate 110 may be a silicon (Si) substrate, and yet the disclosure is not limited thereto. In other embodiments, the substrate 110 may also be a glass substrate, an aluminum oxide substrate, a silicon carbide (SiC) substrate, a III-V group semiconductor substrate, or other substrates suitable for manufacturing a semiconductor structure.

Figure 2:
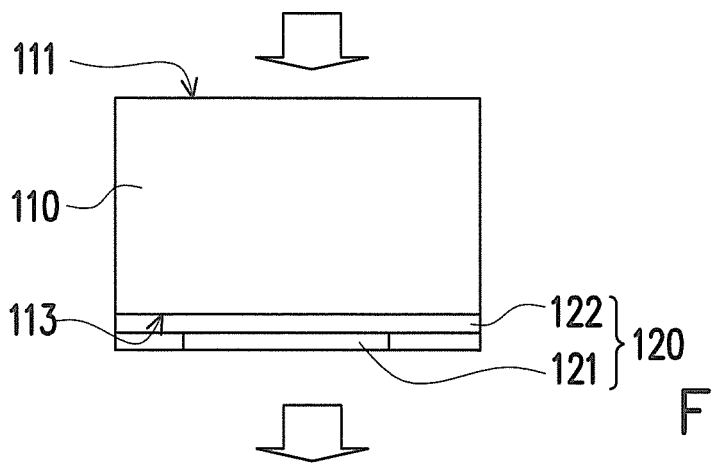

Next, referring to FIG. 2, an device layer 120 is formed on the second surface 113 of the substrate 110, wherein the device layer 120 includes a conductor layer 121 and a first dielectric layer 122 disposed between the conductor layer 121 and the substrate 110. In the present embodiment, the material of the conductor layer 121 may be metal, alloy, metal silicide, or other suitable conductive materials. Moreover, in other embodiments, the conductor layer 121 may also be a doped conductor layer.

Figure 3:
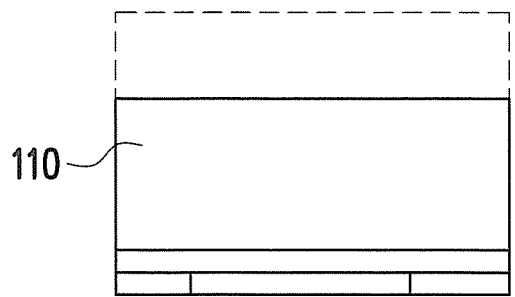
Figure 4:
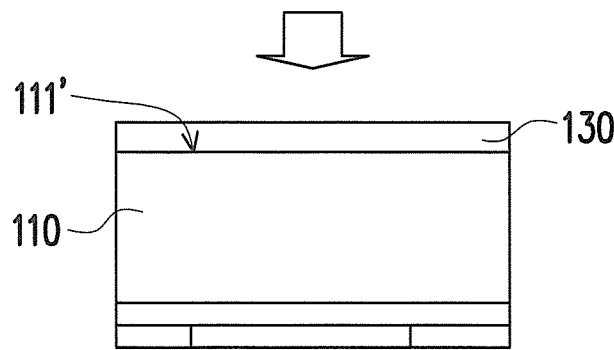

Continuing referring to FIG. 3 and FIG. 4, after the device layer 120 is formed, the substrate 110 may be selectively thinned according to actual requirements. In the present embodiment, the method for thinning the substrate 110 may be done by, for example, a wafer backside grinding process, and yet the disclosure is not limited thereto. Next, as illustrated in FIG. 4, a second dielectric layer 130 may be formed on the new first surface 111' of the thinned substrate 110, and yet the disclosure is not limited thereto. In other embodiments, the step in FIG. 4 may be omitted; that is, the second dielectric layer 130 is not formed on the substrate 110.

Next, a portion of the substrate 110 is removed from the first surface 111' to form at least one through hole (not shown) in the substrate 110. In the present embodiment, before an etching process is performed on the substrate 110, a patterned photo-resist layer may be formed on the substrate 110 through a photolithography process to define the position of the through hole. Then, the substrate 110 is partially removed by the patterned photo-resister layer used as a mask. The approach to partially remove the substrate 110 may be, for example, an etching process. The method for forming the through hole is described with further detail along with FIG. 5A-FIG. 7B hereafter.

Figure 5A:
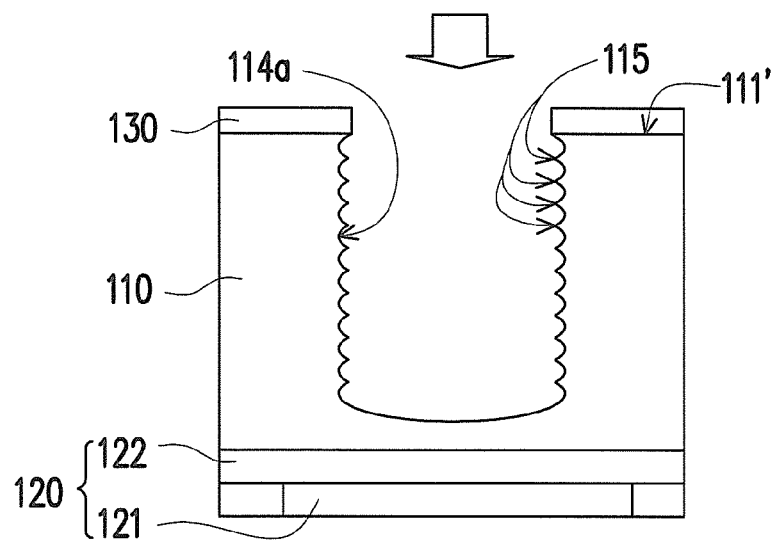
Figure 5B:
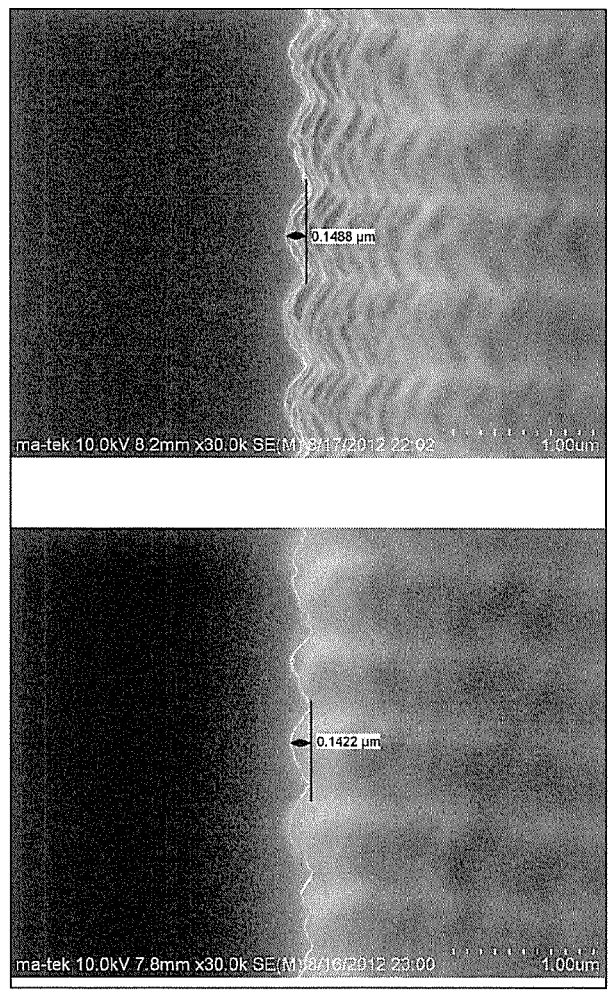
FIG. 5B is a scanning electron microscope image of a local area in FIG. 5A.

FIG. 5A is a cross-sectional schematic diagram of a first side wall portion according to the first embodiment of the disclosure. FIG. 5B is a scanning electron microscope image of a local area in FIG. 5A. Referring to FIG. 5A, a first side wall portion 114a is formed in the substrate 110 under a first etching condition, and the first side wall portion 114a is connected to the first surface 111' of the substrate 110. In the present embodiment, the first etching condition is a Bosch Deep Reactive Ion Etching (Bosch DRIE) process. In general, the Bosch DRIE process includes a plasma etching step with sulphur hexafluoride ($SF_6$) and a passivation step with high-molecular gas, wherein the above-mentioned two steps are performed alternately and continuously to form the first side wall portion 114a in the substrate 110. To be more specific, the passivation step means that the high-molecular gas may form a polymer layer (or a passivation layer) on the first side wall portion 114a on the substrate 110 during the plasma etching step to protect the first side wall portion 114a. In the present embodiment, the high-molecular gas may be octafluorocyclobutane ($C_4F_8$), and yet the disclosure is not limited thereto. In other embodiments, the high-molecular gas may also be octafluoropropane ($C_3F_8$), perfluoro-compound gas with a high carbon/fluorine (C/F) ratio, or other gas suitable for foaming the polymer layer (or the passivation layer).

As illustrated in FIG. 5A and FIG. 5B, since the etching step and the passivation step are performed alternately in the Bosch DRIE process, a plurality of first scallops 115 may be formed on the first side wall portion 114a. Moreover, no matter the dimension of the first scallops 115 is large (as illustrated on the top of FIG. 5B) or small (as illustrated at the bottom of FIG. 5B), the first scallops 115 may appear in regular patterns. Next, the substrate 110 is being etched until approaching to the first dielectric layer 122. Meanwhile, the first side wall portion 114a has not yet exposed the device layer 120.

Figure 6A:
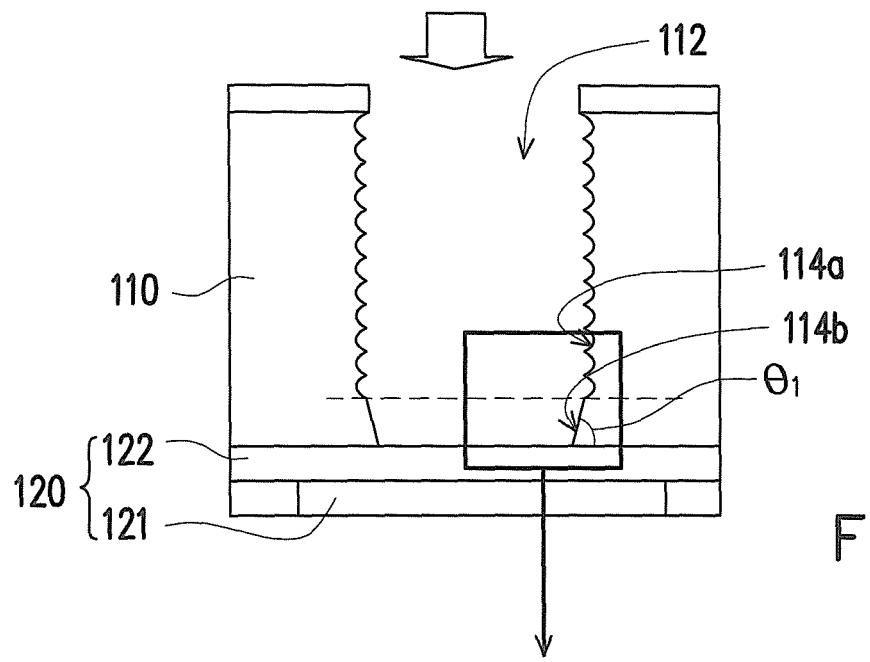
Figure 6B:
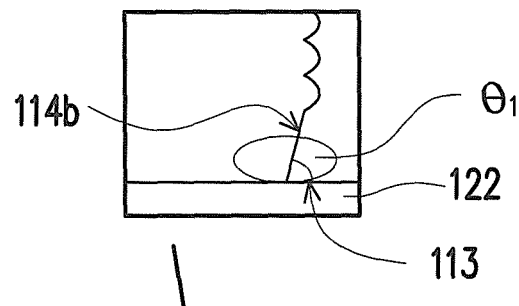
FIG. 6B is an enlarged partial diagram of a side wall of the through hole in FIG. 6A.
Figure 6C:
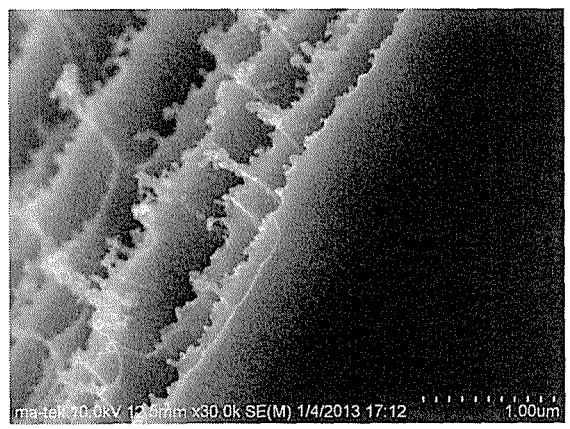
FIG. 6C is a scanning electron microscope image of a local area in FIG. 6B.

FIG. 6A is a cross-sectional diagram of a through hole according to the first embodiment of the disclosure. FIG. 6B is an enlarged partial diagram of a side wall of the through hole in FIG. 6A. FIG. 6C is a scanning electron microscope image of a local area in FIG. 6B. Referring to FIG. 6A, a second side wall portion 114b is formed in the substrate 110 under a second etching condition. In the present embodiment, the method for forming the second etching condition includes adjusting etching parameters of the first etching condition followed by forming the second side wall portion 114b by a non-Bosch DRIE process. To be more specific, as illustrated in FIG. 6B, adjusting the etching parameters of the first etching condition may allow an inclination angle on the first side wall portion 114a so that an included angle $\theta_1$ is formed between the second side wall portion 114b and the second surface 113 during the follow-up non-Bosch DRIE process. Moreover, the non-Bosch DRIE process may be, for example, performing the etching process through an ion bombardment treatment in the present embodiment. Accordingly, as illustrated in FIG. 6C, an irregularly rough surface may appear on the second side wall portion 114b without a plurality of scallops distributed regularly. In other words, the second side wall portion 114b is a non-scalloped surface in the present embodiment.

Revisiting FIG. 6A, the etching process is stopped when reaching the first dielectric layer 122. In the meantime, the second side wall portion 114b is connected to the second surface 113 of the substrate 110, and the first side wall portion 114b and the second side wall portion 114b may form a through hole 112 in the substrate. Moreover, in the present embodiment, the included angle $\theta_1$ between the second side wall portion 114b and the second surface 113 may be an acute angle, wherein the included angle $\theta_1$ is between 30 degrees and 80 degrees. It should be noted that, the range of each of the parameters is merely exemplary in nature and is not intended to limit the disclosure. Furthermore, the included angle $\theta_1$ may vary due to some factors such as a process recipe or a design requirement and may be other angles such as a right angle. Further descriptions along with FIG. 7A and FIG. 7B are as follows.

Figure 7A:
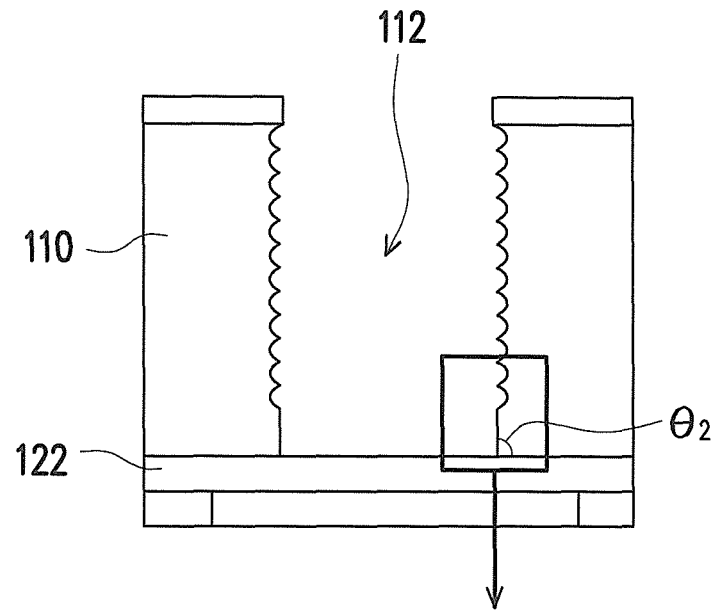
Figure 7B:
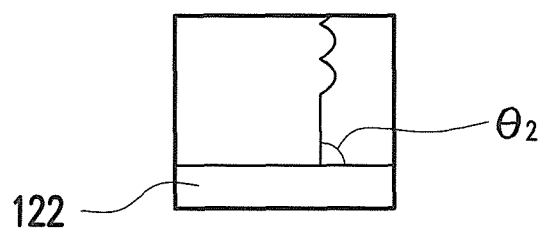
FIG. 7B is an enlarged partial diagram of a side wall of the through hole in FIG. 7A.

FIG. 7A is a cross-sectional diagram of another through hole according to the first embodiment of the disclosure. FIG. 7B is an enlarged partial diagram of a side wall of the through hole in FIG. 7A. Referring to FIG. 7A, within a portion of the substrate 110 with a faster etching rate such as the center of the substrate 110, when the etching process reaches the first dielectric layer 122, the process may not stop immediately but rather control etching parameters and time properly so as to change the outline of the bottom part of the through hole 112. Meanwhile, a side-etching effect is more notable, and an included angle $\theta_2$ may be larger accordingly (approximate to a right angle). In the meantime, as illustrated in FIG. 7B, the included angle $\theta_2$ may be a right angle or slightly smaller than a right angle.

After the through hole 112 in FIG. 6A or FIG. 7A is formed, a conductive post is formed in the through hole 112, wherein the conductive post and the device layer 120 are electrically connected. The method for forming the conductive post is described with further detail along with FIG. 8-FIG. 12A (or FIG. 12B) hereafter. It is noted that, the method for forming the conductive post is illustrated by the through hole 112 in FIG. 6A, and yet the disclosure is not limited thereto. The through hole 112 in FIG. 7A, the second embodiment, the third embodiment, or other embodiments (not shown) may also employ a manufacturing process similar to FIG. 8-FIG. 12A (or FIG. 12B) for manufacturing the conductive post.

Figure 8:
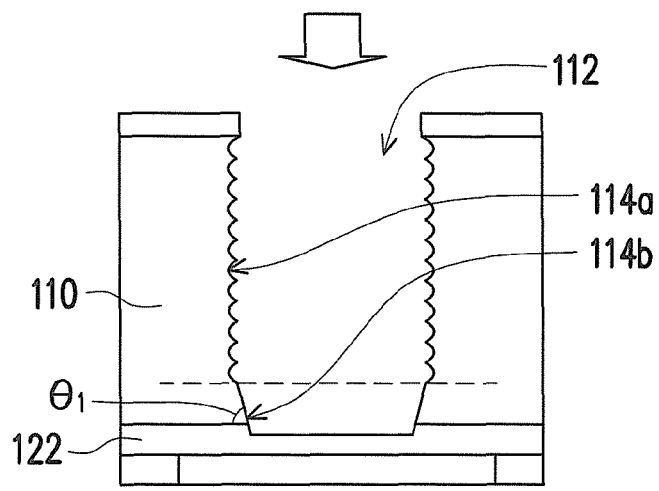

Referring to FIG. 8, after the through hole 112 is formed; a portion of the first dielectric layer 122 may be further removed so as to allow the second side wall portion 114b to extend into the dielectric layer 122 along the non-scalloped surface. In the present embodiment, the method for removing the portion of the first dielectric layer 122 may be, for example, the non-Bosch DRIE process, and yet the disclosure is not limited thereto. In other embodiments, the method for removing the portion of the first dielectric layer 122 may also be a wet etching process.

Figure 9:
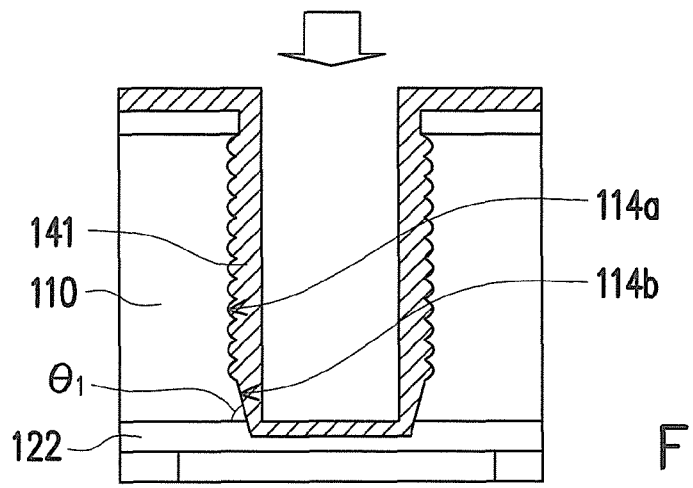

Next, referring to FIG. 9, a liner layer 141 is deposited on the first side wall portion 114a, the second side wall portion 114b, and a portion of the first dielectric layer 122 exposed by the through hole 112. In the present embodiment, the material of the liner layer 141 includes oxides or other suitable insulating materials. Moreover, in the present embodiment, the method for depositing the liner layer 141 includes a chemical vapour deposition (CVD) process. To be more specific, the CVD process includes a thermal CVD process, a plasma enhanced CVD (PE-CVD) process, and a low press CVD (LP-CVD) process. However, in the present embodiment, the method for depositing the liner layer 141 may also be other suitable manufacturing process. The disclosure is not limited herein.

Figure 10:
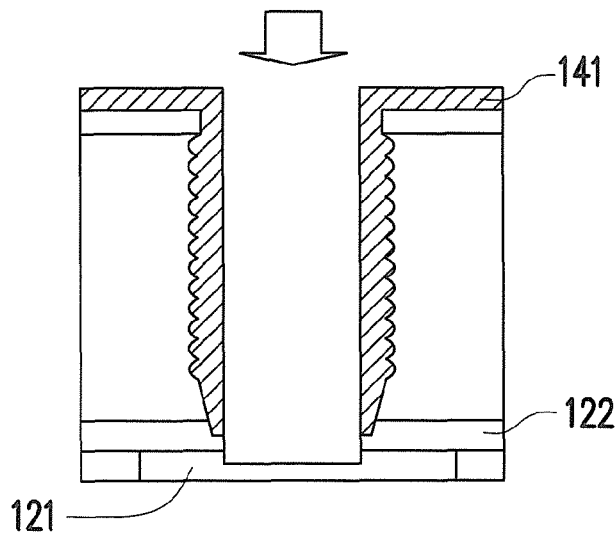

Next, referring to FIG. 10, the liner layer 141 on top of the first dielectric layer 122 and the first dielectric layer 122 are removed so as to expose the conductor layer 121. In the present embodiment, the methods for removing the liner layer 141 and the first dielectric layer 122 are similar to the manufacturing process in FIG. 8 and may not be repeated herein. To be more specific, as illustrated in FIG. 10, during the exposure of the conductor layer 121, a portion of the conductor layer 121 may be removed. For example, the removed portion of the conductor layer may be a silicide layer, and yet the disclosure is not limited thereto. In another embodiment, the conductor layer 121 may include a barrier layer (not shown) and a copper layer (not shown). In such embodiment, while the conductor layer 121 is exposed, the barrier layer may be removed to expose the copper layer. To be more specific, the material of the barrier layer may be tantalum (Ta), tantalum nitride (TaN), titanium (Ti), titanium nitride (TiN), or other suitable materials. Moreover, the copper layer may be substituted by another suitable metal layer. The disclosure is not limited to the copper layer.

Figure 11:
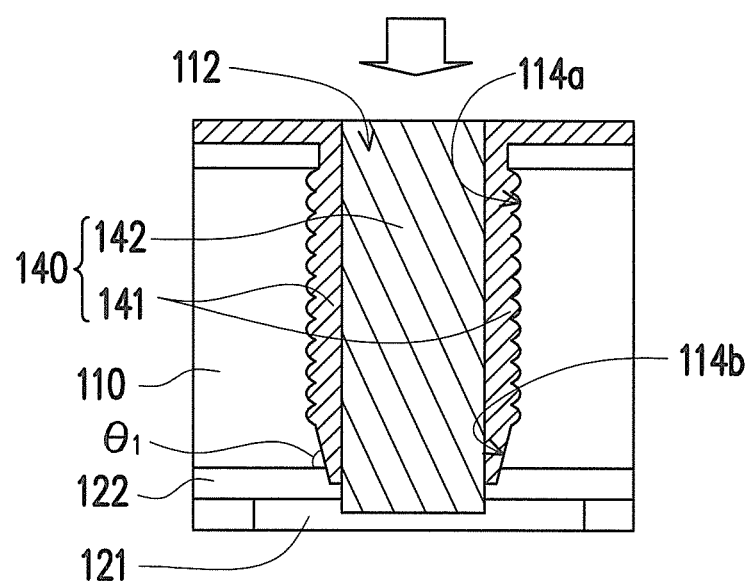

Next, referring to FIG. 11, the through hole 112 is filled up by a conductive material to form a plug 142. In the present embodiment, the conductive material may be copper, tungsten, or other suitable conductive materials. Moreover, in the present embodiment, the method for filling up the through hole 112 by the conductive material includes a physical vapour deposition (PVD) process, a CVD process, and an electroplating plating process or an electroless plating process. To be more specific, the PVD process includes an evaporation process or a sputter deposition process; the CVD process includes a plasma-assisted CVD process; the electroplating process or the electroless plating process is the method for filling up the plug. As illustrated in FIG. 11, the conductive post 140 comprises the liner layer 141 and the plug 142, and the first side wall portion 114a and the second side wall portion 114b are covered by the liner layer 141. Accordingly, the plug 142 and the substrate 110 may be electrically insulated from each other.

Figure 12A:
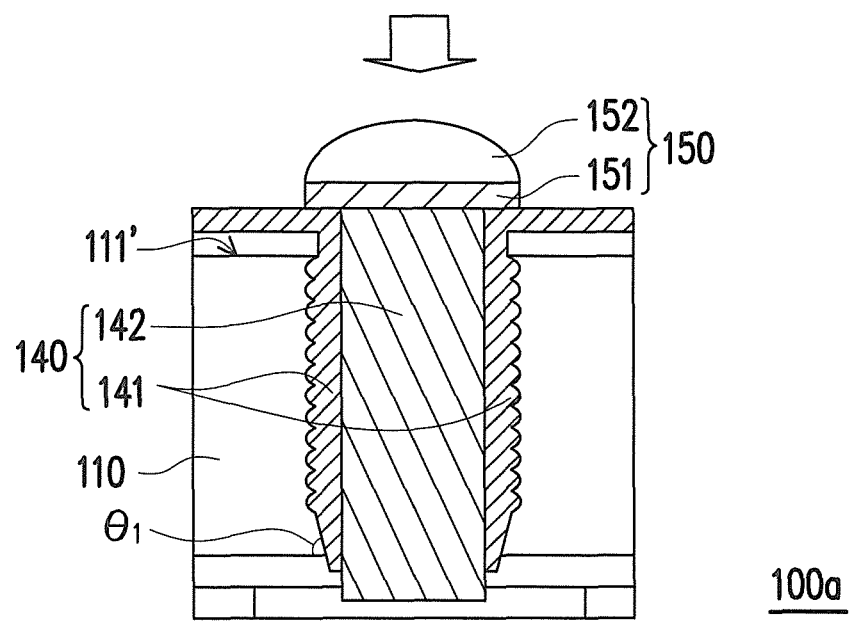
Figure 12B:
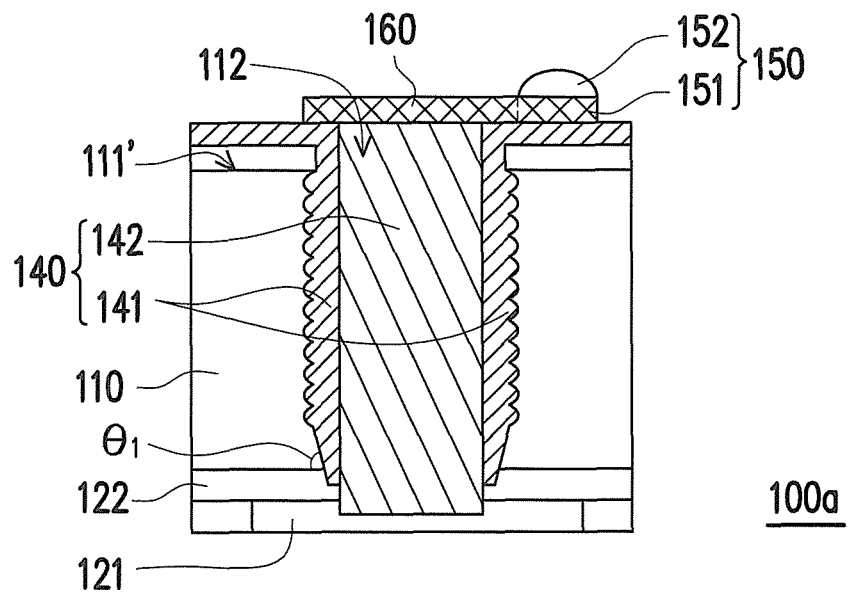
Figure 13:
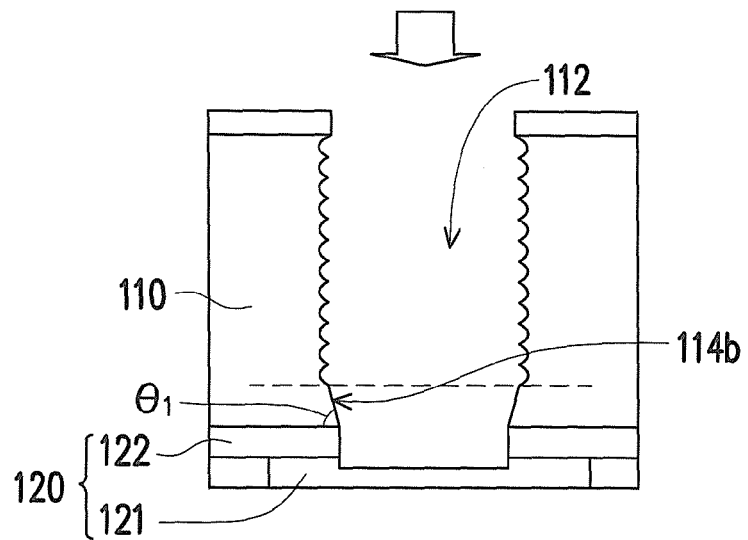
FIG. 13-FIG. 17 are schematic flow diagrams of a manufacturing method for forming a conductive post according to the second embodiment of the disclosure.

FIG. 12A and FIG. 12B are cross-sectional diagrams of different semiconductor structure according to the first embodiment of the disclosure. Referring to FIG. 12A or FIG. 12B, an external terminal 150 is formed on the first surface 111', and a conductive structure 110a of the present embodiment is thus formed. In the present embodiment, the external terminal 150 may include a bonding pad 151 and a bump 152. To be more specific, the bonding pad 151 and the bump 152 may be the same or different conductive materials such as copper, nickel, alloy, or other suitable conductive materials. As illustrated in FIG. 12A, the external terminal 150 of the semiconductor structure 100a is disposed on the first surface 111' and electrically connected to the conductive post 140 to perform a follow-up wafer bonding process. However, it should be noted that the disclosure is not limited thereto. In another embodiment, the manufacturing method for forming the semiconductor structure 100a may further include at least one redistribution layer 160 formed on the first surface 111'. To be more specific, the material of the redistribution layer 160 may be a suitable conductive material such as aluminium, copper, or the alloy thereof. As illustrated in FIG. 12B, the redistribution layer 160 is disposed on the first surface 111', electrically connected to the conductive post 140, and further electrically connected to the external terminal 150 disposed elsewhere according to an actual requirement in the follow-up wafer bonding process. The redistribution layer 160 may re-layout a circuit layer design of the semiconductor structure 100a.

Since different etching conditions may be formed by adjusting the etching parameters or changing the etching process in different etching stages, the two-section structure, the first side wall portion 114a and the second side wall portion 114b, may be formed in the substrate 110. The substrate 110 may be thus prevented from being over-etched or unetched during the formation of the through hole 112. Additionally, the depth of the through hole 112 may be further controlled properly to prevent the formation of notches and may be advantageous for the deposition of the liner layer 141. The liner layer 141 may thus become a continuous insulation layer with a suitable thickness and provide excellent insulation properties to the conductive post 140 and the substrate 110. Therefore, an electrical leakage may be prevented, while the reliability as well as the manufacturing yield of the semiconductor structure 100a may be further enhanced.

It should be noted that, in the disclosure, besides allowing the second side wall portion 114b to extend into the first dielectric layer 122 along the non-scalloped surface, the method for forming the conductive post may also allow the second side wall portion 114b to extend into the conductor layer 121. Further descriptions along with FIG. 13-FIG. 17 are as follows. It should be noted that, the method for forming the conductive post 140 is illustrated by the through hole 112 in FIG. 6A, and yet the disclosure is not limited thereto. The through hole 112 in FIG. 7A, the third embodiment, the fourth embodiment, and other embodiments (not shown) in the disclosure may employ a manufacturing process similar to FIG. 8-FIG. 12A (or FIG. 12B) for manufacturing the conductive post.

[The Second Embodiment]

FIG. 13-FIG. 17 are schematic flow diagrams of a manufacturing method for forming a conductive post according to the second embodiment of the disclosure. Referring to FIG. 13-FIG. 17, the manufacturing method of a semiconductor structure 200a in the present embodiment is similar to that of the semiconductor structure 100a in FIG. 1-FIG. 12A (or 12B), and the differences therebetween are as follows. Referring FIG. 13, after the steps in FIG. 1-FIG. 6A are performed to form the through hole 112, a portion of the first dielectric layer 122 may be further removed so as to allow the second side wall portion 114b to extend into the first dielectric layer 122 and the conductor layer 121 to be exposed. In the present embodiment, the method for removing the portion of the first dielectric layer 122 is similar to the manufacturing process in FIG. 8.

Figure 14:
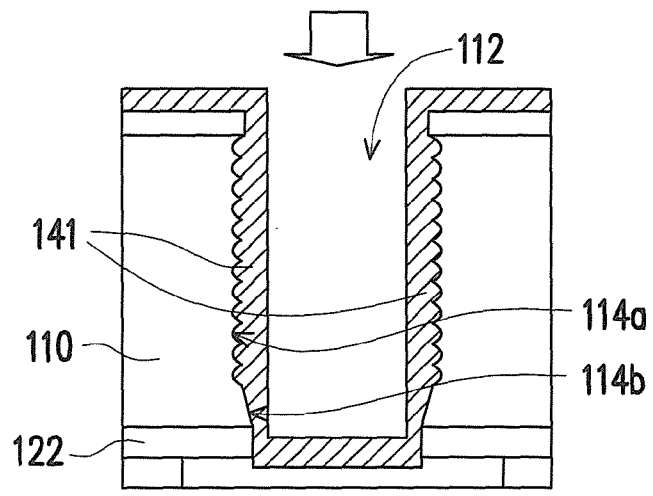
Figure 15:
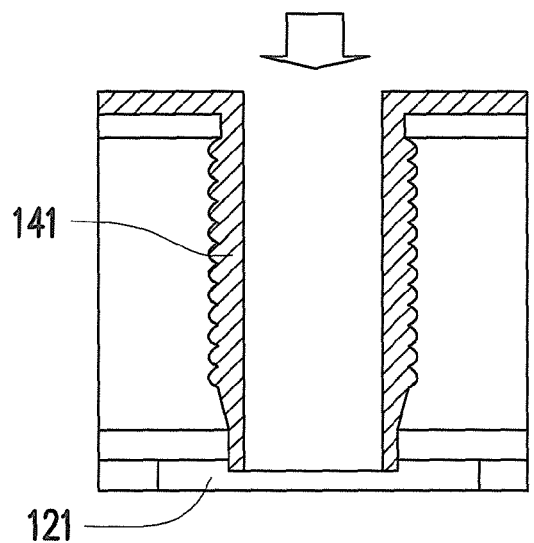
Figure 16:
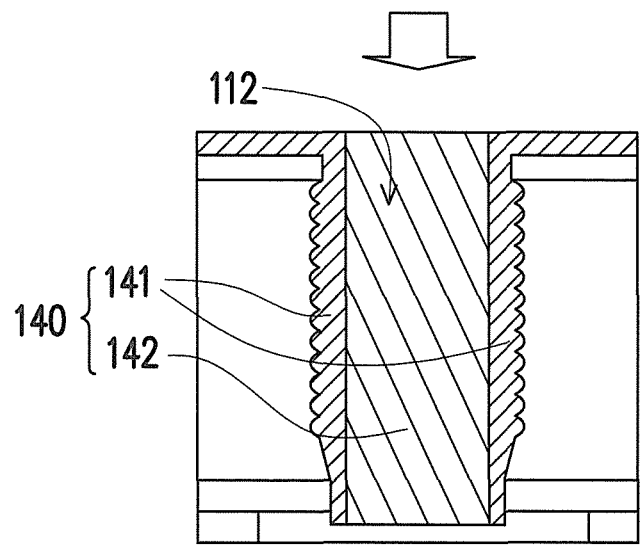

Next, referring to FIG. 14-FIG. 16, the liner layer 141 is first deposited on the first side wall portion 114a, the second side wall portion 114b, and the conductor layer 121 as illustrated in FIG. 14. The liner layer 141 disposed on top of the conductor layer 121 is then removed so as to expose the conductor layer 121 as illustrated in FIG. 15. Next, the through hole 112 is filled up by a conductive material to form the plug 142 as illustrated in FIG. 16. Accordingly, the liner layer 141 and the plug may form the conductive post 140. In the present embodiment, the methods for depositing the liner layer 141, removing the liner layer 141, and filling up the through hole 112 by the conductive material are similar to the manufacturing steps in FIG. 9-FIG. 11. The related detail is described in the previous paragraphs and may not be repeated herein.

Figure 17:
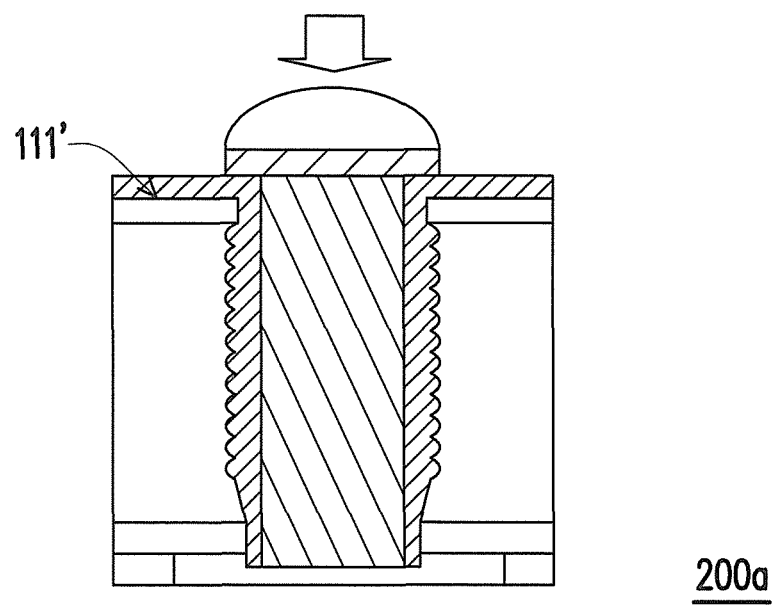

Next, referring to FIG. 17, the external terminal 150 (as illustrated in FIG. 17) or at least one of the redistribution layer 160 (not shown in FIG. 17) is formed on the first surface 111'. Accordingly, the semiconductor structure 200a of the present embodiment is formed. In the present embodiment, the method for forming the external terminal 150 or the at least one redistribution layer 160 is similar to the manufacturing steps in FIG. 12A and FIG. 12B. The related detail is described in the previous paragraphs and may not be repeated herein.

Similarly, since the difference between the semiconductor structure 200a and the semiconductor structure 100a is whether or not the liner layer 141 extends and is connected to the conductor layer 121, it does not affect the electrical connectivity between the conductive post 140 and the device layer 120 as well as the electrical insulation between the conductive post 140 and the substrate 110. Therefore, the manufacturing method for forming the semiconductor structure 200a may include the advantages of the aforementioned manufacturing method for forming the semiconductor structure 100a and may not be repeated herein.

[The Third Embodiment]

Figure 18:
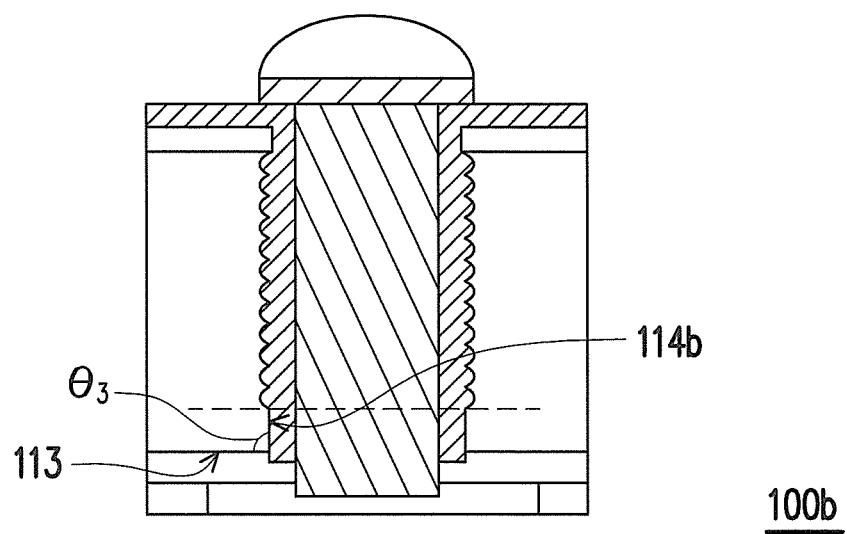
FIG. 18 is a cross-sectional diagram of another semiconductor structure of the disclosure.
Figure 19:
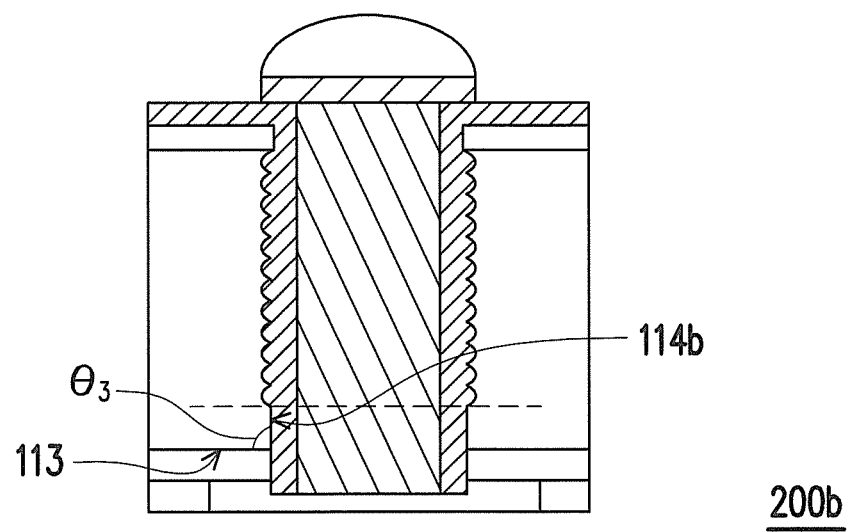
FIG. 19 is a cross-sectional diagram of another semiconductor structure of the disclosure.

FIG. 18 is a cross-sectional diagram of another semiconductor structure of the disclosure. FIG. 19 is a cross-sectional diagram of another semiconductor structure of the disclosure. As illustrated in FIG. 18 and FIG. 19, semiconductor structures 100b and 200b in FIG. 18 and FIG. 19 respectively are similar to the semiconductor structures 100a and 200a in FIG. 12A and FIG. 17. The main difference is that the included angle $\theta_3$ between the second side wall portion 114b and the second surface 113 is a right angle. Therefore, after the through hole 112 in FIG. 7A of the disclosure is formed as well as a conductive post is manufactured by employing the manufacturing process in FIG. 8-FIG. 12A or FIG. 13-FIG. 17, the semiconductor structures 100b and 200b are respectively formed. However, it should be noted that, besides the aforementioned method, the semiconductor structures 100b and 200b may be formed by employing the manufacturing process described hereafter. Further descriptions along with FIG. 20 are as follows.

Figure 20:
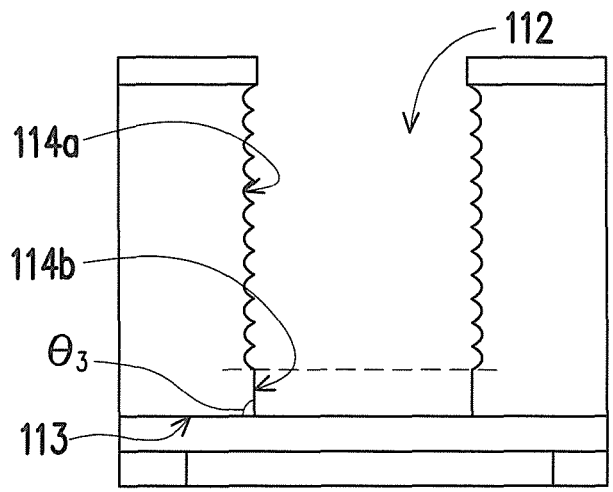
FIG. 20 is a schematic diagram of a manufacturing method for forming a through hole according to the third embodiment in the disclosure.

FIG. 20 is a schematic diagram of a manufacturing method for forming a through hole according to the third embodiment in the disclosure. The method for manufacturing the through hole 112 in the present embodiment is similar to that in FIG. 1-FIG. 7B, and the differences are as follows. Referring to FIG. 20, after the steps in FIG. 1-FIG. 5 are performed so as to form the first side wall portion 114a, the second side wall portion 114b is formed in the substrate 110 under the second etching condition. In the present embodiment, the aforementioned second etching condition is to form the second side wall portion 114b by the Bosch DRIE process. Therefore, the included angle $\theta_3$ between the second side wall portion 114b and the second surface 113 may be a right angle or slightly smaller than a right angle. Next, the manufacturing process of the conductive post may be performed by employing the manufacturing process in FIG. 8-FIG. 12A or FIG. 13-FIG. 17. Then, the semiconductor structures 100b and 200b are thus formed. The related detail of the remaining steps is described in the first embodiment and the second embodiment. The related detail may be referred to the previous paragraphs and may not be repeated herein.

Moreover, in the present embodiment, one skilled in the art may perform the manufacturing process in FIG. 12B based on an actual requirement for the circuit layout design of the semiconductor structures 100b and 200b. The related detail is described in the first embodiment. The related detail may be referred to the previous paragraphs and may not be repeated herein.

[The Fourth Embodiment]

Figure 21A:
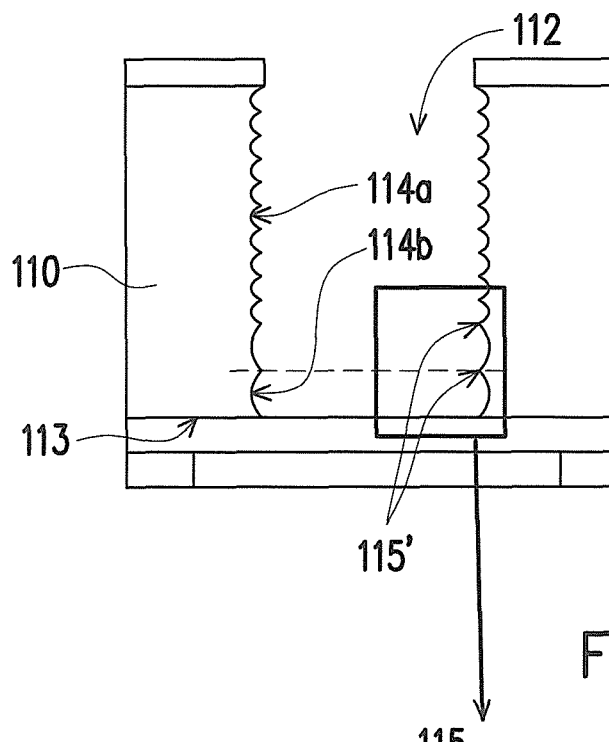
FIG. 21A is a schematic diagram of a manufacturing method for forming a through hole according to the fourth embodiment of the disclosure.
Figure 21B:
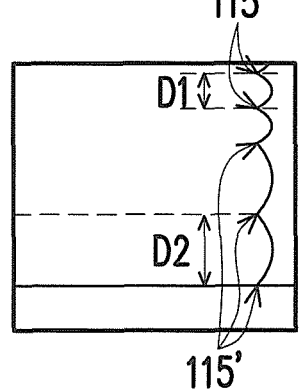
FIG. 21B is an enlarged partial diagram of a side wall of the through hole in FIG. 21A.

FIG. 21A is a schematic diagram of a manufacturing method for forming a through hole according to the fourth embodiment of the disclosure. FIG. 21B is an enlarged partial diagram of a side wall of the through hole in FIG. 21A. Referring to FIG. 21A, after the steps in FIG. 1-FIG. 5 are performed to form the first side wall portion 114a, the second side wall portion 114b is aimed in the substrate 110 under the second etching condition. The first side wall portion 114a and the second side wall portion 114b may form the through hole 112 in the substrate 110. In the present embodiment, the method for forming the second etching condition includes adjusting the etching parameters of the first etching condition followed by forming the second side wall portion 114b by the Bosch DRIE method. Therefore, the second side wall portion 114b may include a plurality of second scallops 115', wherein the second scallops 115' may appear in regular patterns as well. Additionally, as illustrated in 21B, in the present embodiment, a dimension $D_1$ of the first scallops 115 may be less than a dimension $D_2$ of the second scallops by properly adjusting the etching parameters of the first etching condition.

Figure 22:
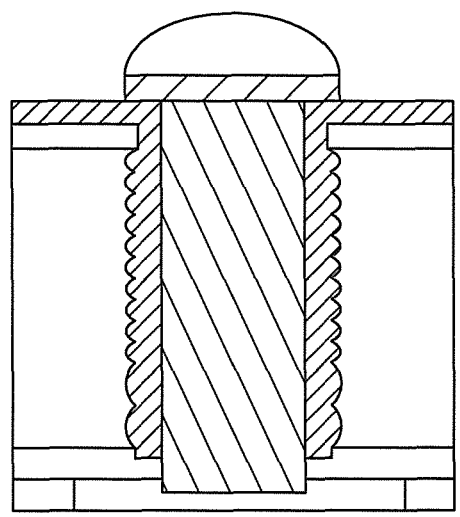
FIG. 22 is a cross-sectional diagram of a semiconductor structure according to the fourth embodiment of the disclosure.
Figure 23:
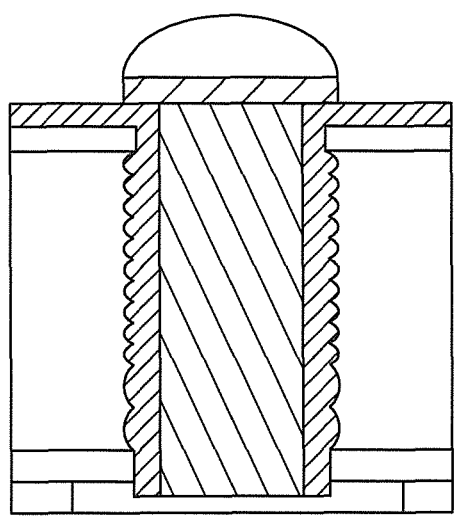
FIG. 23 is a cross-sectional diagram of another semiconductor structure according to the fourth embodiment of the disclosure.

FIG. 22 is a cross-sectional diagram of a semiconductor structure according to the fourth embodiment of the disclosure. FIG. 23 is a cross-sectional diagram of another semiconductor structure according to the fourth embodiment of the disclosure. Referring to FIG. 22 and FIG. 23, after the through hole 112 in FIG. 21A is formed, a conductive post may be manufactured by employing the manufacturing process in FIG. 8-FIG. 12A or FIG. 13-FIG. 17. Then, semiconductor structures 300a and 300b are thus formed respectively. The related detail of the steps is described in the first embodiment and the second embodiment. The related detail may be referred to the previous paragraphs and may not be repeated herein.

It should be noted that, besides an arc shape as illustrated in FIG. 21B, the shape of the second scallops 115' may be different due to a process recipe or a design requirement. The etching time may be controlled so as to form different outlines. Further descriptions along with FIG. 24A-FIG. 26 are as follows.

Figure 24A:
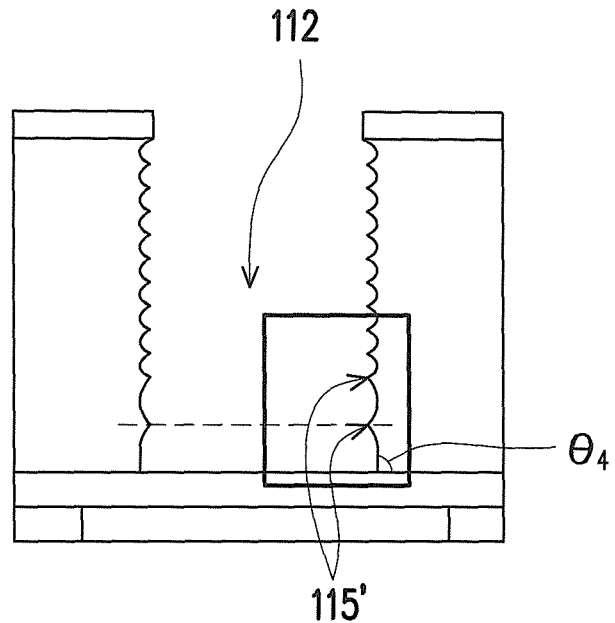
FIG. 24A is a cross-sectional diagram of another through hole according to the fourth embodiment of the disclosure.
Figure 24B:
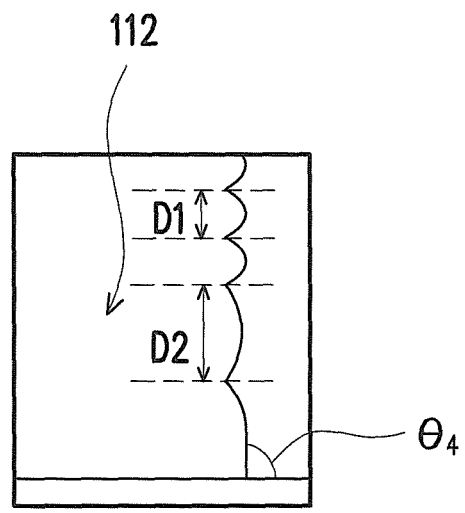
FIG. 24B is a partial enlarged diagram of a side wall of the through hole in FIG. 24A.

FIG. 24A is a cross-sectional diagram of another through hole according to the fourth embodiment of the disclosure. FIG. 24B is a partial enlarged diagram of a side wall of the through hole in FIG. 24A. Referring to FIG. 24A, the manufacturing step in FIG. 24A is similar to that in FIG. 7A and may change the outline of the bottom part of the through hole 112 by adjusting the etching time properly. Meanwhile, the side-etching effect may be more notable and an included angle $\theta_4$ may be larger accordingly (approximate to a right angle). Meanwhile, as illustrated in FIG. 24B, the included angle $\theta_4$ may be a right angle or slightly smaller than a right angle. The related detail may be referred to the related paragraphs and may not be repeated herein.

Figure 25:
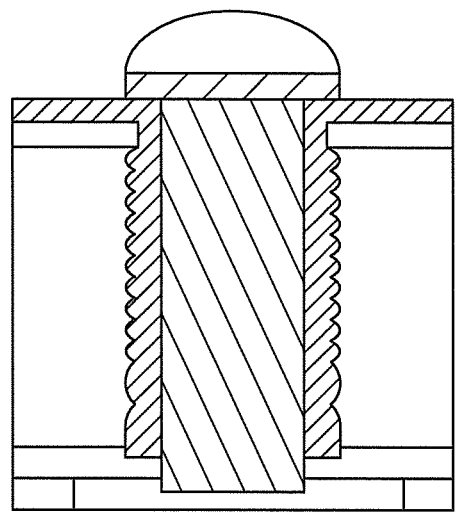
FIG. 25 is a cross-sectional diagram of another semiconductor structure according to the fourth embodiment of the disclosure.
Figure 26:
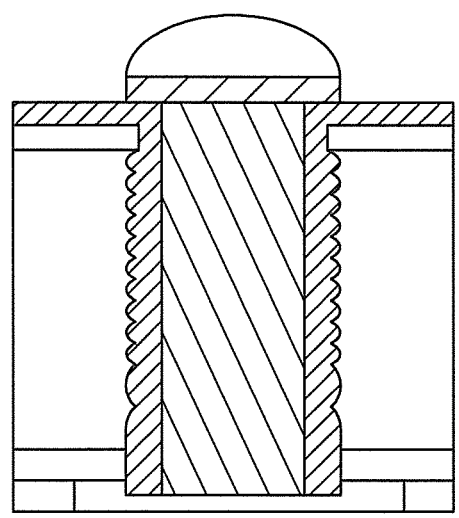
FIG. 26 is a cross-sectional diagram of another semiconductor structure according to the fourth embodiment of the disclosure.

FIG. 25 is a cross-sectional diagram of another semiconductor structure according to the fourth embodiment of the disclosure. FIG. 26 is a cross-sectional diagram of another semiconductor structure according to the fourth embodiment of the disclosure. After the through hole 112 in FIG. 24A is formed, a conductive post may be manufactured by employing the manufacturing process in FIG. 8-FIG. 12A or FIG. 13-FIG. 17 so as to form semiconductor structures 300c and 300d. The related detail of the related steps is described in the first embodiment and the second embodiment. The related detail may be referred to the previous paragraphs and may not be repeated herein.

Moreover, in the present embodiment, the one skilled in the art may perform the manufacturing process in FIG. 12B based on an actual requirement for the circuit layout design of the semiconductor structures 300a, 300b, 300c, and 300d. The related detail is described in the first embodiment. The related detail may be referred to the previous paragraphs and may not be repeated herein.

Since the difference among the semiconductors 300a, 300b, 300c, and 300d is the existence of the second scallops 115', which may not affect the technical features of the electrical connectivity between the conductive post 140 and the device layer 120 as well as the electrical insulation between the conductive post 140 and the substrate 110, the manufacturing methods for forming the semiconductor structures 300a, 300b, 300c, and 300d may include the advantages of the aforementioned manufacturing method for forming the semiconductor structure 100a and may not be repeated herein.

To sum up, in the disclosure, different etching conditions may be formed in different etching stages by adjusting etching parameters or changing an etching method. Therefore, a two-section structure may be formed on a side wall of a through hole. It may be advantageous for adjusting the depth of the through hole so as to prevent the formation of notches and may also be advantageous for a follow-up manufacturing process. An electrical leakage may be prevented, and the reliability as well as the manufacturing yield of a semiconductor structure may be enhanced.

[The Fifth Embodiment]

FIG. 27A through FIG. 27F are schematic flow diagrams of a fabricating of a semiconductor device according to the fifth embodiment of the disclosure.

Figure 27A:
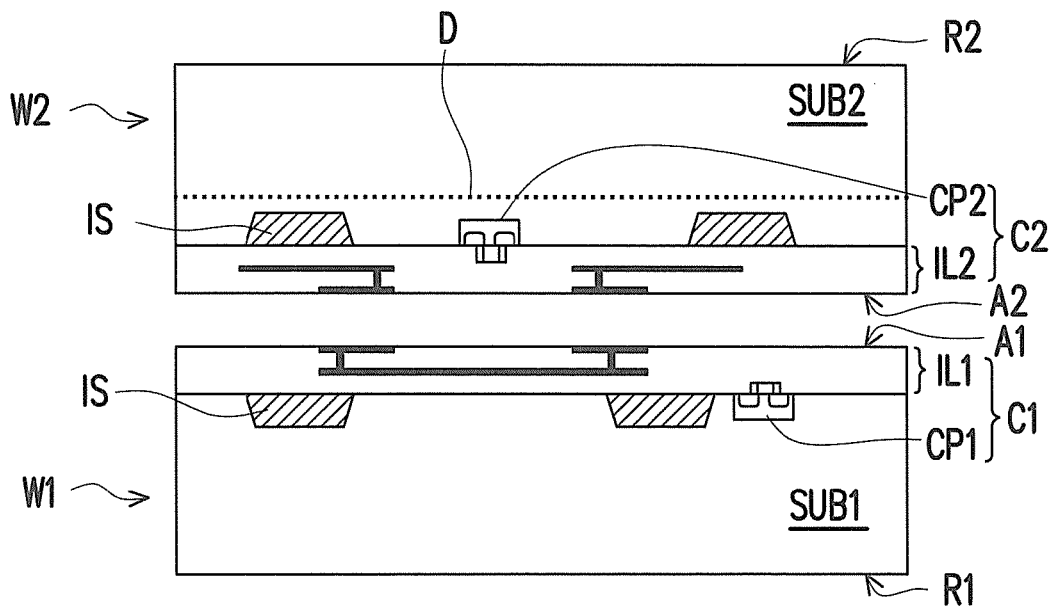
FIG. 27A through FIG. 27F are schematic flow diagrams of a fabricating of a semiconductor device according to the fifth embodiment of the disclosure.

Referring to FIG. 27A, a first wafer W1 and a second wafer W2 are provided. The first wafer W1 has a first active surface A1 and a first rear surface R1 opposite to the first active surface A1 while the second wafer W2 has a second active surface A2 and a second rear surface R2 opposite to the second active surface A2. In this embodiment, the first wafer W1 comprises a first circuit C1 formed therein and the second wafer W2 comprises a second circuit C2 formed therein. For example, the first wafer W1 comprises a first semiconductor substrate SUB1 and a first interconnection layer IL1 wherein the first semiconductor substrate SUB1 comprises a plurality of first components CP1 formed therein, the first interconnection layer IL1 is formed on the first semiconductor substrate SUB1, and the first interconnection layer IL1 is electrically connected to the first components CP1. Similarly, the second wafer W2 comprises a second semiconductor substrate SUB2 and a second interconnection layer IL2, wherein the second semiconductor substrate SUB2 comprises a plurality of second components CP2 formed therein, the second interconnection layer IL2 is formed on the second semiconductor substrate SUB2, and the second interconnection layer IL2 is electrically connected to the second components CP2. In this embodiment, the first wafer W1 and the second wafer W2 may be wafers having a plurality of memory devices formed thereon. However, the semiconductor devices on the first wafer W1 and the second wafer W2 are not limited thereto.

Figure 27B:
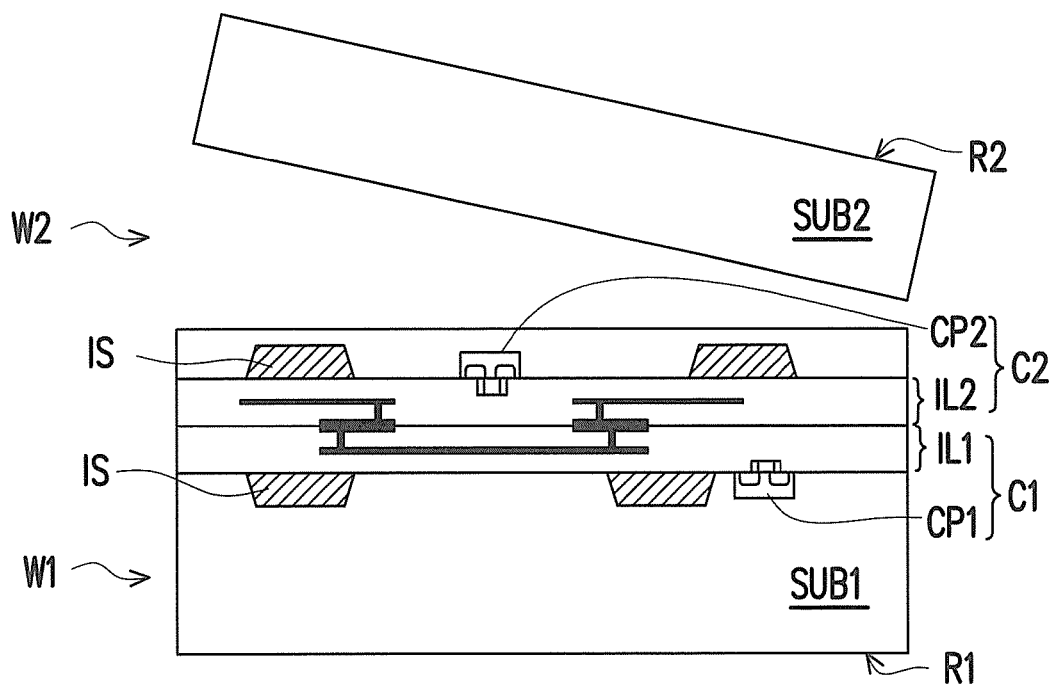

Referring to FIG. 27B, after the first wafer W1 and the second wafer W2 are provided, a wafer-level bonding process is performed to bond the first active surface A1 of the first wafer W1 with the second active surface A2 of the second wafer W2 such that the first circuit C1 and the second circuit C2 are electrically connected to each other. After the first wafer W1 and the second wafer W2 are bonded, the second wafer W2 is thinned from the second rear surface R2. For example, the method for thinning the second wafer W2 may be accomplished by a wafer backside grinding process (e.g., chemical mechanical polish process) or an etch process. When the second wafer W2 is grinded or etched, a portion of the second semiconductor substrate SUB2 is removed. However, the disclosure is not limited thereto.

Referring to FIG. 27A and FIG. 27B, in this embodiment, in order to facilitate the thinning process of the second wafer W2, the second semiconductor substrate SUB2 of the second wafer W2 may further comprises a detach interface D formed therein, the second components CP2 are located at one side of the detach interface D. A portion of the second semiconductor substrate SUB2 is detached from the detach interface D when thinning the second wafer W2 from the second rear surface R2. For example, a thermal process may be pertained on the second wafer W2 such that the portion of the second semiconductor substrate SUB2 detached from the detach interface D can be physically separated from the second circuit C2. The detach interface D can be formed during the fabricating process of the second circuit C2 by an ion implant process. Accordingly, the thinning process of the second wafer W2 can be accomplished without damaging the first circuit C1 of the thinned second wafer W2.

As shown in FIG. 27A and FIG. 27B, the second semiconductor substrate SUB2 of the second wafer W2 further comprises a plurality of isolation structures IS, wherein the isolation structures IS define a plurality of active regions, and the second components CP2 are formed in the active regions. Specifically, areas that are not occupied by the isolation structures IS are defined as active regions and the second components CP2 are formed in the active regions. For example, the isolation structures IS may be shallow trench isolations (STI), field oxide (FOX) and so on.

Figure 27C:
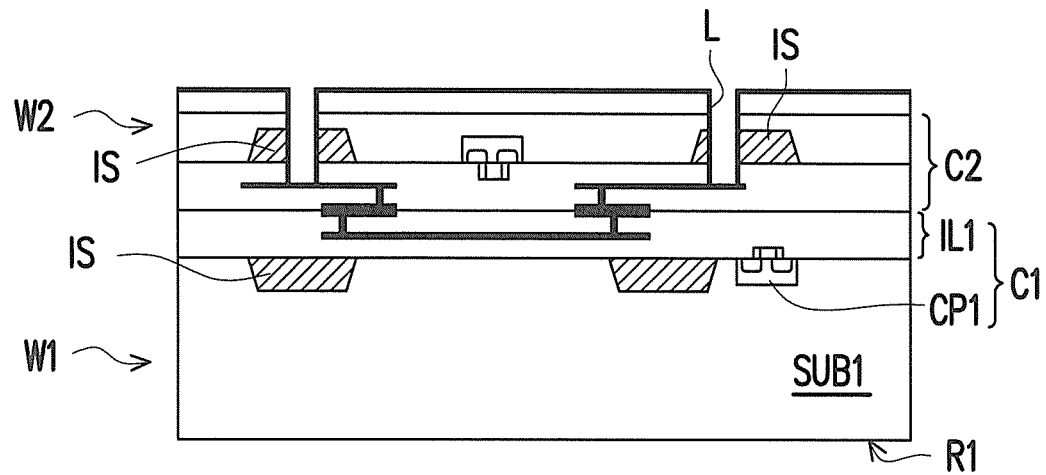
Figure 27D:
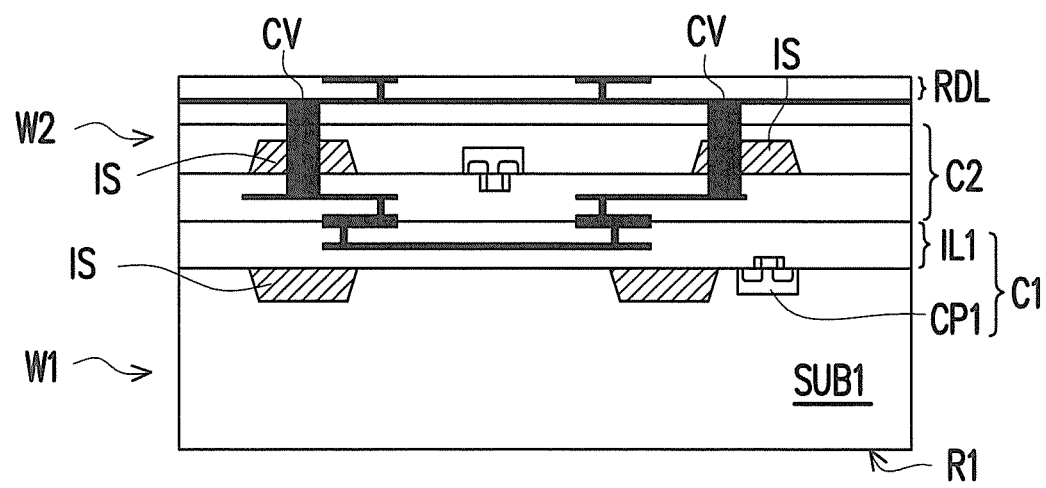

Referring to FIG. 27C and FIG. 27D, after the second wafer W2 is thinned, one or more conductive through vias CV are formed in the second wafer W2, wherein the conductive through vias CV are electrically connected to the first circuit C1 of the first wafer W1 through the second circuit C2 of the thinned second wafer W2.

As shown in FIG. 27C, one or more through holes TH are formed in the second wafer W2. The through holes TH are, for example, formed by a photolithography and etch process. After the through holes TH are formed, a liner L may be optionally formed over the second wafer W2 such that at least sidewalls of the through holes TH can be covered by the liner L. In this embodiment, the material of the liner is, for example, silicon oxides, silicon nitride and so on.

Figure 28:
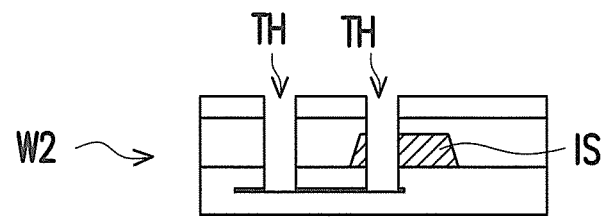
FIG. 28 is an enlarged view of the through holes in the thinned second wafer.

As shown in FIG. 28, the position of the through holes TH can be determined based on actual requirements. For example, the through holes TH may penatrate one of the isolation structures IS or penetrate one of the active resions.

As shown in FIG. 27D, after the through holes TH are formed, a conductive material are formed over the second wafer W2 and the through holes TH are partially or entirely filled by the conductive material such that the conductive through vias CV are formed in the through holes TH. The conductive through vias CV formed within the through holes TH may penatrate one of the isolation structures IS or penetrate one of the active resions. In this embodiment, the material of the conductive through vias CV is, for example, copper, tungsten and so on.

In this embodiment, after the conductive through vias CV are formed, a re-distribution wiring layer RDL may be optionally formed over the second wafer W2, wherein the re-distribution wiring layer RDL is electrically connected to the conductive through vias CV. For example, the re-distribution wiring layer RDL comprises a plurality of wiring layers and at least one dieletrice layer sandwiched by the wiring layers.

By performing the process flow illustrated in FIG. 27A through FIG. 27D, the second wafer W2 is stacked over and bonded to the first wafer W1. One ordinary skilled in the art may have requirements to bond one or more wafers to the second wafer W2 so as to obtain a more compact semiconductor device. The detailed description regarding the subsequent wafer-level bonding process of additional wafers is illustrated in accompany with FIG. 27E and FIG. 27F.

Figure 27E:
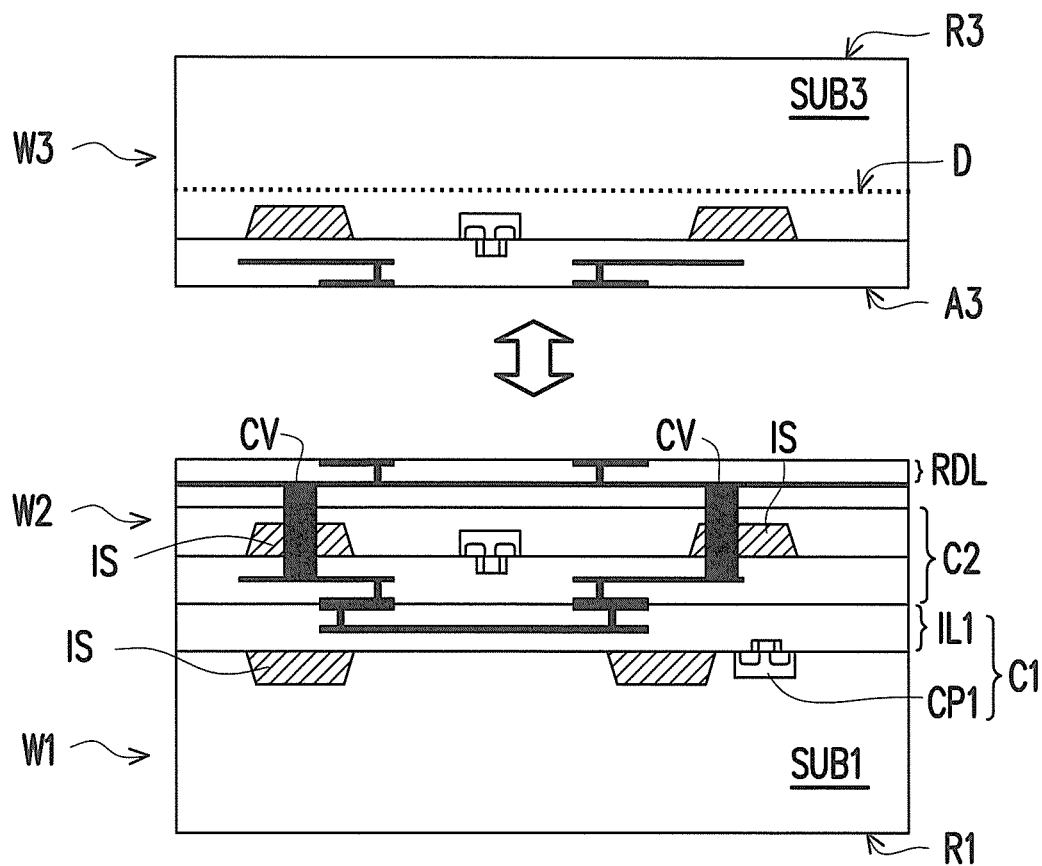

Referring to FIG. 27E, a third wafer W3 is provided. The third wafer W3 has a third active surface A3 and a third rear surface R3 opposite to the third active surface A3. The details of the third wafer W3 is similar with those of the second wafer W2. After the third wafer W3 is provided, a wafer-level bonding process is performed to bond the third active surface A3 of the third wafer W1 with the second wafer W2 such that the third wafer W3, the first wafer W1 and the second wafer W2 are electrically connected to one other. After the third wafer W3 and the second wafer W2 are bonded, the third wafer W3 is thinned from the third rear surface R3. For example, the method for thinning the third wafer W3 may be accomplished by a wafer backside grinding process (e.g., chemical mechanical polish process) or an etch process. However, the disclosure is not limited thereto.

In this embodiment, in order to facilitate the thinning process of the third wafer W3, the third wafer W3 may further comprises a detach interface D formed therein. A portion of the third wafer W3 is detached from the detach interface D. For example, a thermal process may be performed on the third wafer W3 such that the portion of the third wafer W3 can be detached from the detach interface D. The detach interface D can be formed during the fabricating process of the second circuit C3 by an ion implant process. Accordingly, the thinning process of the third wafer W3 can be accomplished without damaging the circuit of the thinned third wafer W3.

Figure 27F:
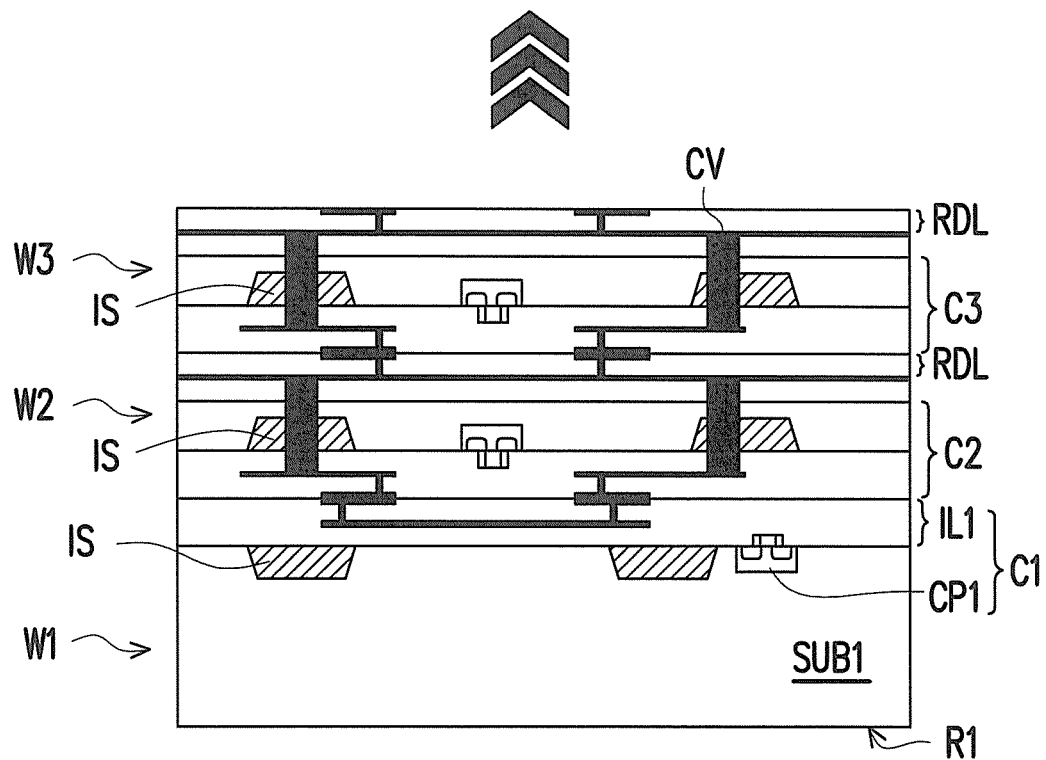

Referring to FIG. 27F, after the third wafer W3 is thinned, one or more conductive through vias CV are formed in the third wafer W3, wherein the conductive through vias CV are electrically connected to the third wafer W3 and the second wafer W2. As shown in FIG. 27F, after the conductive through vias CV are formed, a re-distribution wiring layer RDL may be optionally formed over the third wafer W3, wherein the re-distribution wiring layer RDL is electrically connected to the conductive through vias CV. For example, the re-distribution wiring layer RDL comprises a plurality of wiring layers and at least one dieletrice layer sandwiched by the wiring layers. The method of forming the conductive through vias CV is similar with that illustrated in FIG. 27C and FIG. 27D and the detailed descriptions are thus omitted.

It is noted that, in this embodiment, a fourth wafer, a fifth wafer and so on may be provided and stacked over the third wafer W3 by repeating the above-mentioned wafer-level bonding process, and yet the disclosure is not limited thereto.

[The Sixth Embodiment]

Figure 29A:
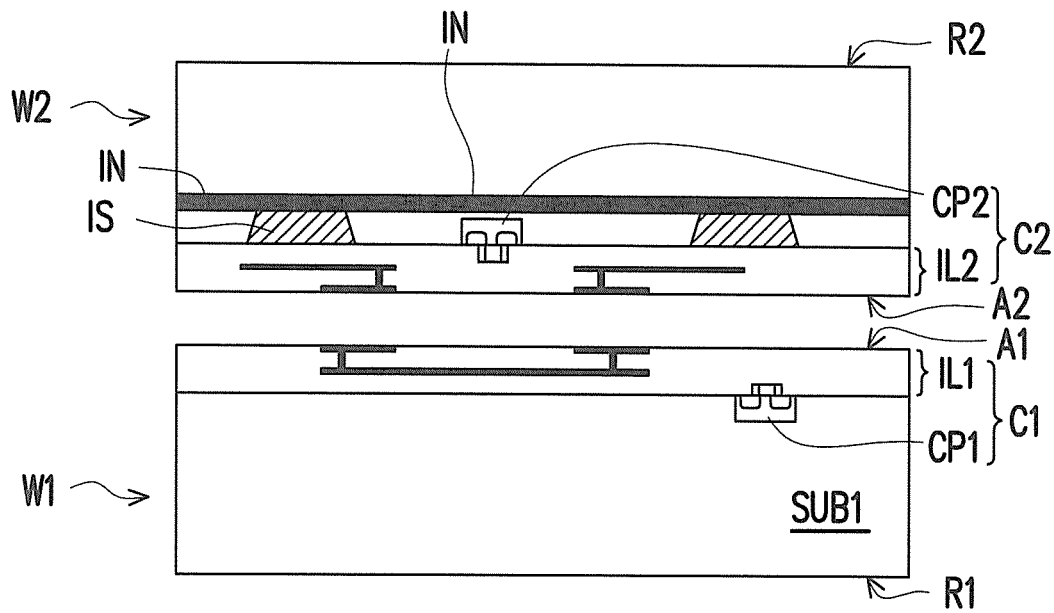
FIG. 29A through FIG. 29F are schematic flow diagrams of a fabricating of a semiconductor device according to the sixth embodiment of the disclosure.
Figure 29B:
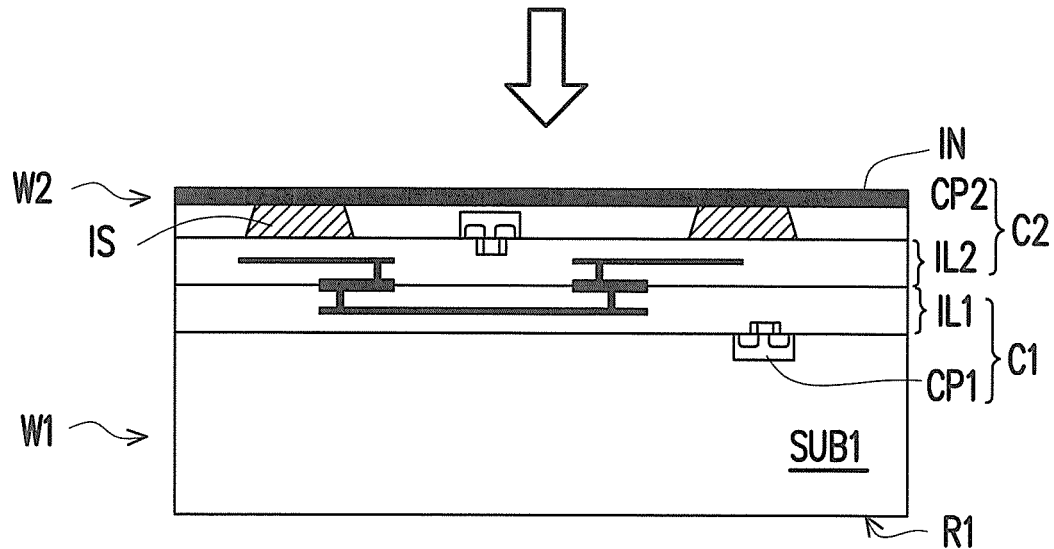
Figure 29C:
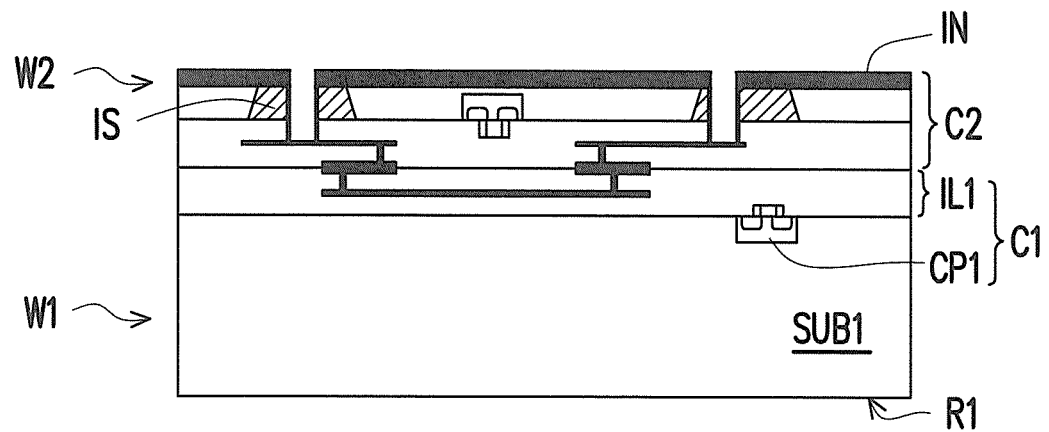
Figure 29D:
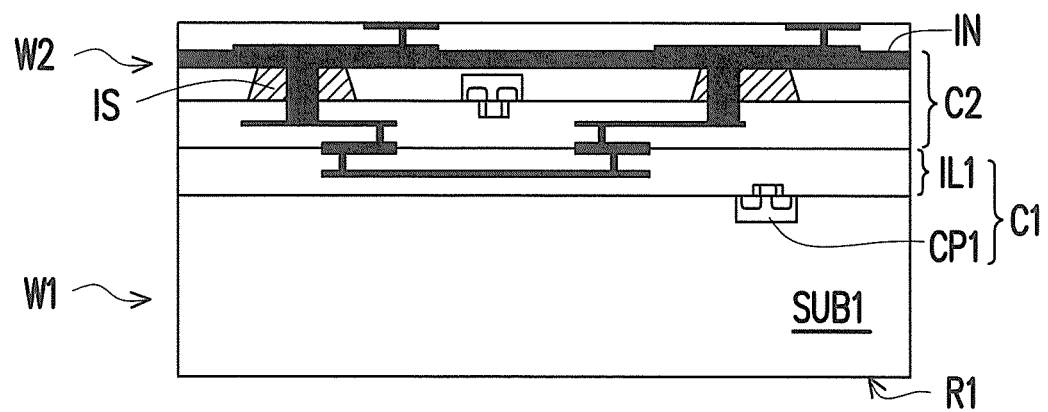
Figure 29E:
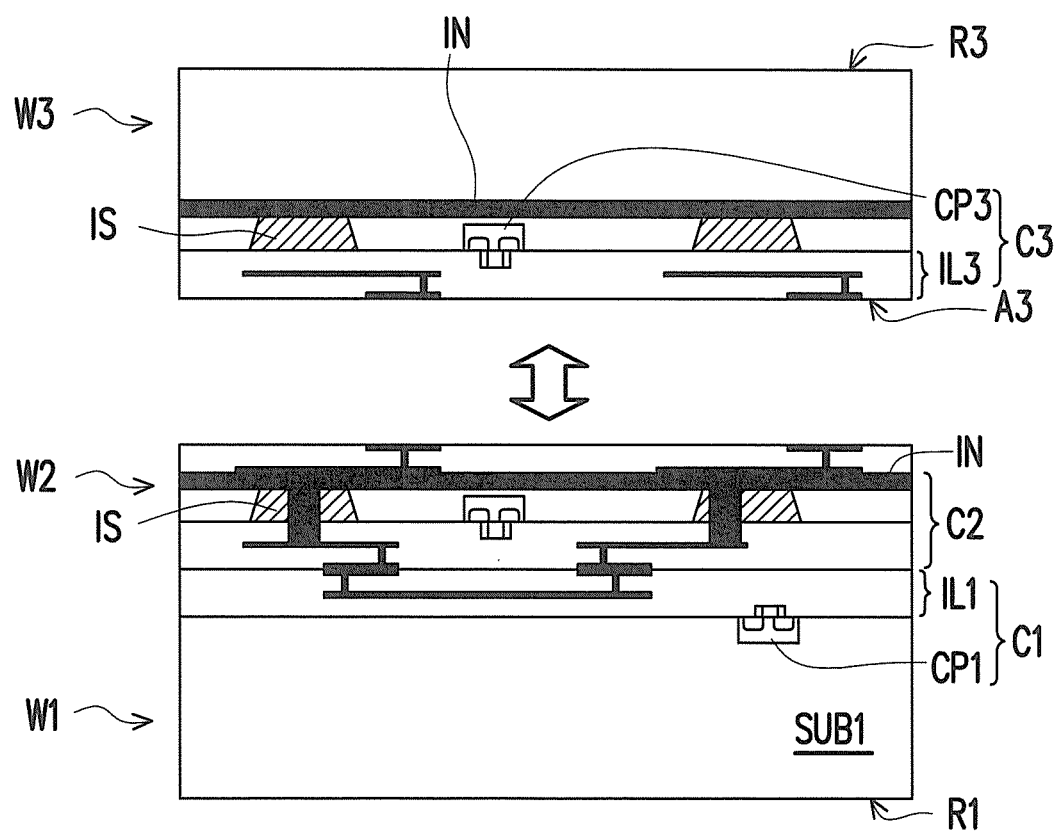
Figure 29F:
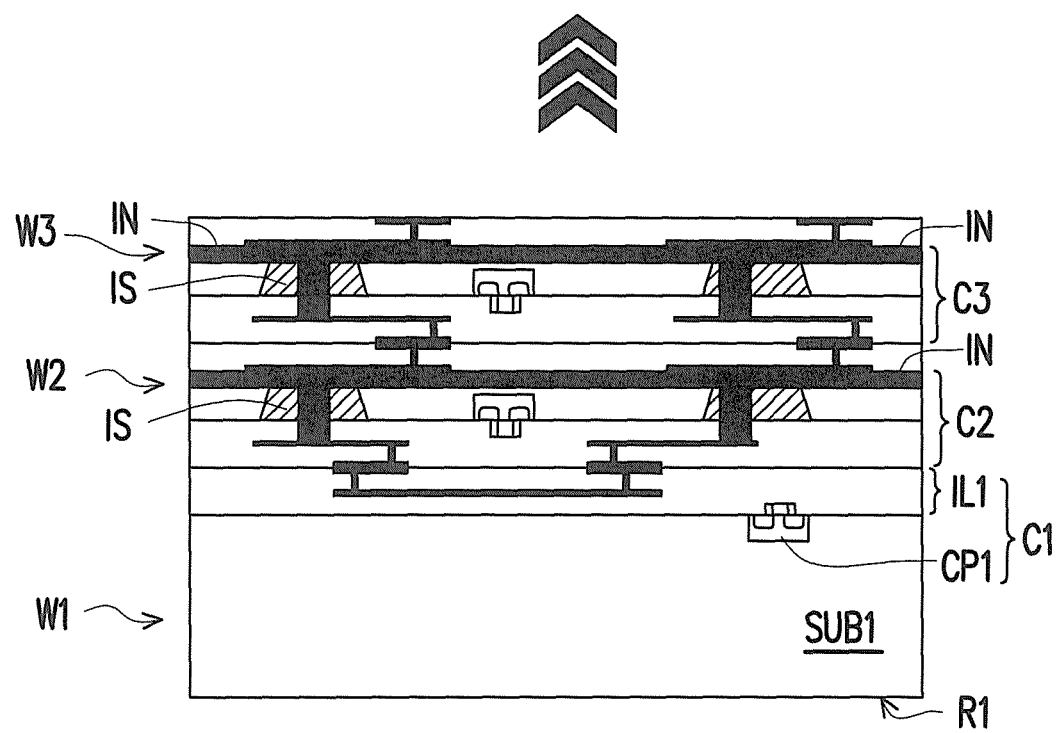

FIG. 29A through FIG. 29F are schematic flow diagrams of a fabricating of a semiconductor device according to the sixth embodiment of the disclosure. The process flow of this embodiment is similar with the process flow illustrated in the fifth embodiment except that the second wafer W2 and the third wafer W3 are silicon-on-insulator (SOI) wafers. As shown in FIG. 29B, a portion of the second semiconductor substrate SUB2 of the second wafer W2 is removed (e.g., grinded or etched) until an insulator IN of the second wafer W2 is exposed when thinning the second wafer W2 from the second rear surface R2.

In an alternative embodiment, the first wafer W1 may be a SOI wafer also. It is noted that the above-mentioned wafers (i.e., the first wafer W1, the second wafer W2 and the third wafer W3) may have the same design, similar designs or different designs. The disclosure does not limited the design of each wafer.

According to the fifth and the sixth embodiments, a compact semiconductor device can be fabricated through the above mentioned wafer-level bonding processes.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A method for fabricating a semiconductor device, comprising:
    providing a first wafer having a first active surface and a first rear surface opposite to the first active surface, the first wafer comprising a first circuit formed therein; wherein the first wafer comprises:
    a first semiconductor substrate comprising a plurality of first components therein; and
    a first interconnection layer on the first semiconductor substrate, wherein the first interconnection layer is electrically connected to the first components;
    providing a second wafer having a second active surface and a second rear surface opposite to the second active surface, the second wafer comprising a second circuit formed therein; wherein the second wafer comprises:
    a second semiconductor substrate comprising a plurality of second components therein; and
    a second interconnection layer on the second semiconductor substrate, wherein the second interconnection layer is electrically connected to the second components,
    bonding the first active surface of the first wafer with the second active surface of the second wafer so as to electrically connecting the first circuit and the second circuit;
    thinning the second wafer from the second rear surface; and
    forming at least a conductive through via in the second wafer, wherein the conductive through via is electrically connected to the first circuit through the second circuit,
    wherein forming the at least a conductive through via in the second wafer comprises:
        forming a first side wall portion in the second semiconductor substrate under a first etching condition; wherein the first side wall portion is connected to the second interconnection layer on the second semiconductor substrate, and the first side wall portion comprises a plurality of first scallops;
        forming a second wall portion in the second semiconductor substrate under a second etching condition; wherein the second side wall portion is connected to the second rear surface of the second semiconductor substrate, the first side wall portion and the second side wall portion form a through hole; and
        forming a conductive post in the through hole to form the conductive through via, wherein the conductive post and the second interconnection layer are electrically connected.

2. The method for fabricating a semiconductor device of claim 1, wherein the first wafer comprises a silicon-on-insulator (SOI) wafer.

3. The method for fabricating a semiconductor device of claim 1, wherein a portion of the second semiconductor substrate is removed when thinning the second wafer from the second rear surface.

4. The method for fabricating a semiconductor device of claim 1, wherein the second wafer comprises:
    a detach interface in the second semiconductor substrate, the second components being located at one side of the detach interface.

5. The method for fabricating a semiconductor device of claim 4, wherein a portion of the second semiconductor substrate is detached from the detach interface when thinning the second wafer from the second rear surface.

6. The method for fabricating a semiconductor device of claim 1, wherein the second wafer comprises a silicon-on-insulator (SOI) wafer.

7. The method for fabricating a semiconductor device of claim 6, wherein a portion of the second semiconductor substrate is removed until an insulator of the SOI wafer is exposed when thinning the second wafer from the second rear surface.

8. The method for fabricating a semiconductor device of claim 1, wherein the second semiconductor substrate of the second wafer comprises:
    a plurality of isolation structures and a plurality of second components disposed therein, wherein the isolation structures define a plurality of active regions, and the second components are formed in the active regions.

9. The method for fabricating a semiconductor device of claim 8, wherein the conductive through via penatrates one of the isolation structures.

10. The method for fabricating a semiconductor device of claim 8, wherein the through hole penatrates one of the active regions.

11. The method for fabricating a semiconductor device of claim 1 further comprising:
    forming a re-distribution wiring layer over the second semiconductor substrate after the conductive through via is formed, wherein the re-distribution wiring layer is electrically connected to the conductive through via.

12. The method for fabricating a semiconductor device of claim 1, wherein the second side wall portion comprises a non-scalloped surface, and an included angle is formed between the non-scalloped surface and the second surface.

* * * * *